United States Patent [19]

Keyser

[11] Patent Number: 4,484,978
[45] Date of Patent: Nov. 27, 1984

[54] ETCHING METHOD

[75] Inventor: Thomas Keyser, Mountain View, Calif.

[73] Assignee: Fairchild Camera & Instrument Corp., Mountain View, Calif.

[21] Appl. No.: 535,148

[22] Filed: Sep. 23, 1983

[51] Int. Cl.³ .......... B44C 1/22; C03C 15/00; C03C 25/06; C23F 1/02
[52] U.S. Cl. .................. 156/643; 156/651; 156/653; 156/657; 156/659.1; 156/661.1; 204/192 E
[58] Field of Search .......... 156/643, 646, 651, 652, 156/653, 657, 659.1, 661.1, 662; 427/38, 39; 204/192 E; 430/313, 317

[56] References Cited

U.S. PATENT DOCUMENTS 4,352,724 10/1982 Sugishima et al. .......... 204/192 E
4,372,034 2/1983 Bohr .......... 29/577
4,417,947 11/1983 Pan .......... 156/646 X

FOREIGN PATENT DOCUMENTS 57-20450 2/1982 Japan .......... 156/643

Primary Examiner—William A. Powell
Attorney, Agent, or Firm—Burns, Doane, Swecker & Mathis

[57] ABSTRACT

The disclosure relates to techniques for etching layered materials to produce features with beveled edges, for example, wells in silicon oxide layers employed in integrated circuit fabrication. An anisotropic etch may be employed to form wells with vertical walls in the silicon oxide layer, and an isotropic etch may be employed to bevel peripheral corners of the walls. In preferred embodiments, a double mask of a photoresist layer on an underlying thin film may be used to define the limits of the anisotropic and isotropic etches, respectively.

16 Claims, 10 Drawing Figures

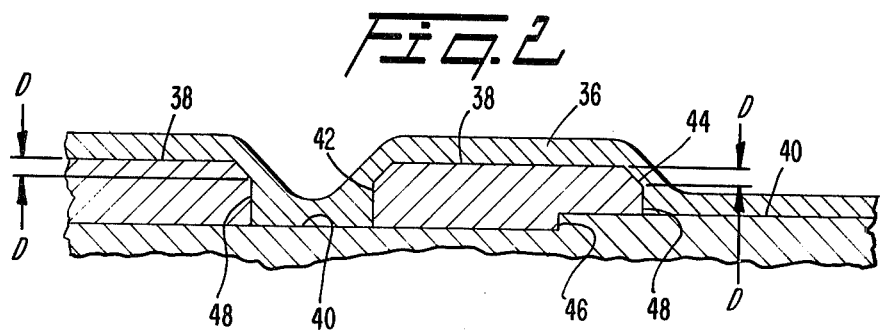
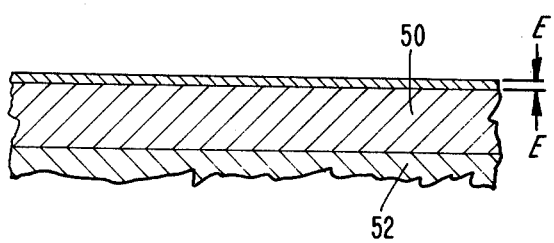
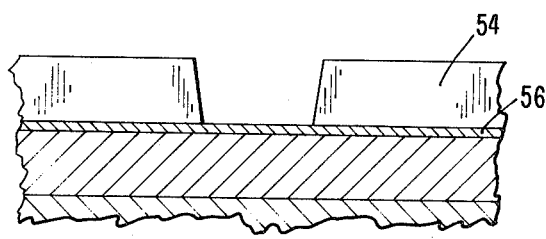
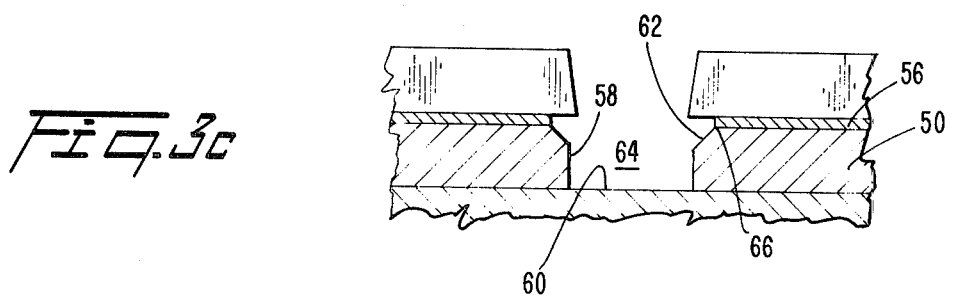

ETCHING METHOD

BACKGROUND

The invention relates to techniques for etching layered materials to produce features in one or more of the layers, especially features having vertical walls and beveled edges, such as wells in a silicon oxide layer employed in integrated circuit fabrication to provide access through the layer to a substrate underlying the layer.

Developments in integrated circuit technology have resulted in the fabrication of devices with increasing numbers of layers, smaller features and increasing complex electrical interconnections. It is conventional to form a layer of silicon dioxide over the device, for example, to isolate it from the environment or interconnection conductors, and to etch wells in the silicon dioxide layer through which electrical interconnections are made to selected regions of the device. Typically the interconnections are one or more layers of metal evaporated or sputtered onto the silicon oxide and into the wells to form the desired interconnect pattern. As feature size is reduced, it becomes increasingly important to employ fabrication techniques such as anisotropic etching which form sharp well edges at locations defined by an overlying mask. However, these techniques can result in the formation of corners or steps in the well wall profile which are difficult to cover with overlying layers, particularly when the overlying layer is an evaporated or sputtered metal coating. As the surface topology becomes more complex with the formation of additional layers, the problem of step discontinuities in overlying layers is aggravated.

It is known in the prior art to round edges of silicon dioxide layers by a technique known as "reflowing" which involves the softening or melting of the silicon dioxide after the wells have been formed. However, this technique requires heating of the oxide to a temperature on the order of 1000° C., and, thus may result in degradation of the device, for example, by diffusion of impurities from the oxide into the underlying structures or by redistribution of dopants in the substrate.

Other prior art techniques depend on the erosion of photoresist films to taper side walls of the wells. Unfortunately, uniform slopes cannot be obtained on many integrated circuit wafers since thickness and chemical composition, hence, etching rates, in the various areas of the circuit can differ significantly.

Isotropic plasma etching methods normally produce steep, undercut side walls with sharp corners and, in many applications, do not provide sufficient selectivity over silicon substrates.

In contrast, wet chemical etching can provide selectivity over silicon substrates, but also can undercut masking layers. Attempts to improve edge profiles with resist lifting agents, rapidly etched taper controlling films, and implantation damaged layers, may result in difficulties in controlling the size of the feature or well.

Accordingly, it is an object of the present invention to produce etched features which reduce step discontinuities in deposited layers overlying the etched layer features.

It is another object of the present invention to reduce step discontinuities in deposited metal layers overlying a silicon oxide layer with features etched therein, while preserving the desired size of the etched feature.

It is another object of the present invention to reduce such step discontinuities while providing substantially vertical feature walls, sharply defined by an overlying mask.

It is another object of the present invention to provide an etched feature wall in a silicon oxide layer with an improved profile.

It is another object of the present invention to provide an etched feature wall in a silicon oxide layer having horizontal dimensions which are substantially independent of oxide thickness, composition and surface topology.

It is another object of the present invention to provide etching techniques for producing features in a silicon oxide layer with substantially vertical walls intersecting a horizontal silicon substrate, without substantially etching the underlying silicon substrate.

These and other objects and features will be apparent from this application including the appended claims and drawings.

SUMMARY OF THE INVENTION

The present invention relates to techniques for etching a feature in a layer overlying a substrate such as in the fabrication of solid state circuits. The term "substrate," as used herein, is meant to indicate underlying structures of varying complexity including but not limited to silicon wafers in which circuit structures have been formed with epitaxial silicon layers, polysilicon layers, metal films, insulating layers and combinations for the foregoing. Advantageously, the feature is bounded, at least in part, by a wall etched in a silicon oxide layer. The wall may extend substantially perpendicularly from a principal plane of the substrate to a beveled edge which joins the wall to a principal surface of the silicon oxide layer.

According to the method of the present invention, a two layer etching mask is formed to facilitate etching of the feature. The first layer may consist of a thin deposited film, or a thin layer of ion damaged silicon oxide. A second mask layer, typically a photoresist layer, may be formed on top of the first mask layer. An opening may be formed in the second mask layer for defining the feature. The first mask layer may be selectively etched to undercut the second mask layer in regions adjacent to a peripheral edge of the opening. The silicon oxide may then be anisotropically etched in the opening to form a substantially vertical wall in the silicon oxide, the wall being a substantially vertical projection toward the substrate of the edge of the opening in the second mask layer. The anisotropic etch may be terminated before the etching front reaches the substrate to leave a thin, protective oxide layer. The silicon oxide may then be isotropically chemically etched to bevel the edge in the undercut region, to thereby form a beveled peripheral edge in the silicon oxide layer. The thin, protective oxide layer may be removed by this isotropic etch to expose the substrate.

In preferred embodiments of the present invention, the anisotropic etch is performed with a fluorine deficient plasma. The second mask layer may be a photoresist layer and the first mask layer a film separately deposited on the silicon oxide. Advantageously, the film is selectively etched by an etchant which more rapidly attacks the film then the silicon oxide or photoresist, to form the undercut region. The film may be of a material selected from the group consisting of metal film, silicon film, silicon nitride film and polymer film. In a preferred embodiment the film is an aluminum film between 100 and 2,000 Angstroms thick, and, preferably, from 800 to 1,200 Angstroms thick.

The foregoing techniques may advantageously be employed to fabricate useful features in solid state silicon devices having wells with walls having a novel profile including a vertical portion of varying length generally perpendicular to a substantially horizontal surface of the substrate exposed at the bottom of the well. The profile also exhibits a beveled peripherial edge portion of generally constant depth from well to well, the edge being characteristic of simultaneous isotropic etching of the silicon oxide layer from a vertical wall and from an exposed peripherial etch window aligned with the well and extending horizontally away from the well from 2,000 to 8,000 Angstroms.

BRIEF DESCRIPTION OF THE DRAWINGS

Embodiments of the present invention are described in connection with the appended drawings. Similar structures are shown in more than one drawing and are identified by like numerals.

FIG. 2 is a cross-sectional view of an integrated circuit structure of the present invention, on which a metal interconnection layer has been deposited.

FIGS. 3a through 3c are cross-sectional views of an integrated circuit structure illustrating sequential fabrication steps in another preferred embodiment of the present invention employing a layer of ion damaged silicon oxide.

DETAILED DESCRIPTION

A method of a preferred embodiment of the present invention will now be described with sequential reference to FIGS. 1a through 1e.

Figure 1A:
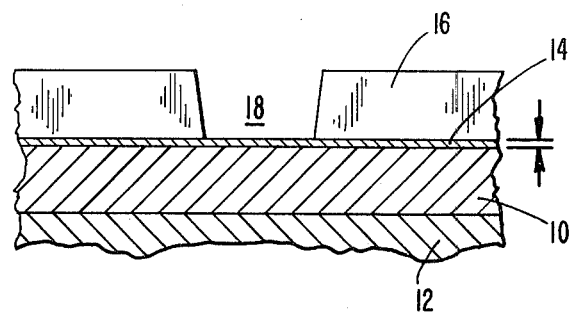
FIGS. 1a through 1e are cross-sectional views of an integrated circuit structure illustrating sequential fabrication steps of a preferred embodiment of the present invention employing a thin metal film and a photoresist layer as a double mask.

FIG. 1a depicts a layer of silicon dioxide 10 overlying a substrate 12. The present invention relates to a method for etching a feature such as a well or opening in a silicon dioxide layer such as 10. Advantageously, the well will be defined by one or more walls in the silicon oxide layer, the walls extending substantially perpendicularly from a principal horizontal plane of the substrate to a beveled edge joining a vertical wall portion to a horizontal principal surface of the silicon oxide layer. As used herein the words "vertical" and "horizontal" are used in their most general sense to indicate only substantial orthogonality of structures.

In order to form the desired features in the silicon dioxide layer 10, a thin film 14 of a metal, such as aluminum, or of silicon nitride, silicon or silicone polymer may be formed on the silicon dioxide layer 10. Subsequently, a second layer, such as a photoresist mask layer 16 may be formed on the film 14, and a window 18 defined therein.

Figure 1B:
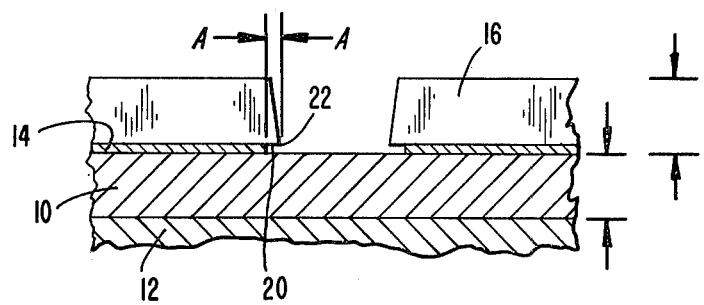

The structure defined in FIG. 1a may be subjected to a selective etch to form the structure of FIG. 1b by etching the film 14 to undercut the second layer 16 in a region 20 along a peripherial edge 22 of the opening. A horizontal demension of the undercut region is indicated at A—A, and may, in preferred embodiments be from 1,000 to 8,000 Angstroms in width.

The structure shown in FIG. 1b may be subjected to an anisotropic dry etch such as a reactive ion etch or plasma etch. The plasma etch may be one employing a fluorine deficient plasma. The anisotropic etch may be used to form either of the structures shown in FIG. 1c and 1c'. The anisotropic etching action forms substantially vertical walls 24 shown in both figures. The difference in the structures of FIGS. 1c and 1c' is a thin residual oxide layer 27 at the bottom of a well 26 of FIG. 1c'. No such layer is present in the structure of FIG. 1c. It will be readily understood that such a residual layer may be formed by terminating the anisotropic etch prior to reaching the surface 28 of the substrate. The provision of such a residual layer may help avoid plasma damage to the substrate, especially the introduction of contaminant metals, such as iron or sodium, and may help to avoid damage to the substrate due to lack of selectivity of the plasma etch.

Figure 1C:
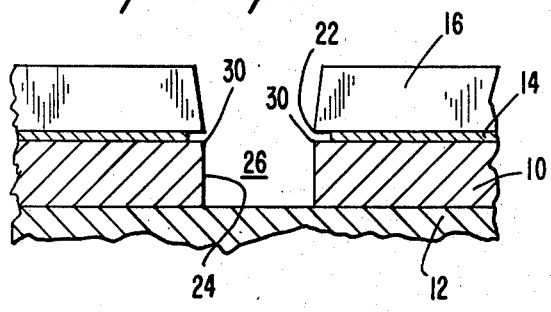
Figure 1C:
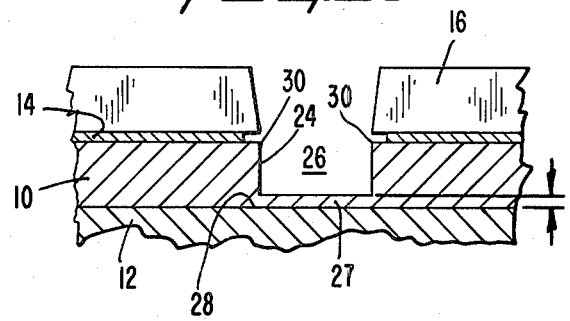
Figure 1D:
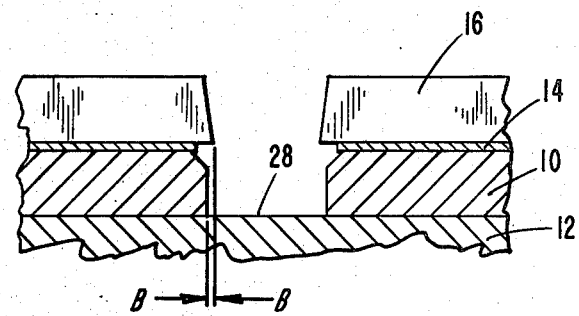

The structures of FIG. 1c and 1c' may be subjected to a wet chemical etch to form the structure shown in FIG. 1d. It will be understood, first, that the wet chemical etch will attack the residual silicon oxide layer 27 of FIG. 1c' thereby removing the residual layer and exposing the surface 28 of the substrate. The wet chemical etch is an isotropic etch which will tend to attack edge portions 30 of the silicon oxide well. This is so because two attack fronts are exposed to the etchant, one front beginning from the vertical wall 24 of the well and the other front beginning from the undercut region 20. The substantially vertical wall 24 remains intact during the isotropic etch. The vertical wall will be of a dimensions which preserve the feature size dictated by the photoresist mask to within a tolerance of from about 200 to 400 Angstroms as indicated by the dimension B—B of FIG. 1d.

Figure 1E:
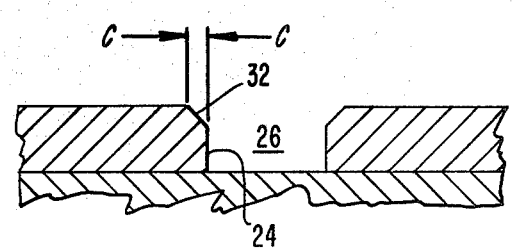

A one or two stage removal sequence may be employed to remove the photoresist layer 16 and film layer 14 to form the structure shown in FIG. 1e. In an alternative embodiment the film layer 14 may be retained in the structure as a final constituent of the circuit, for example, in the case where the film is an aluminum film, the film might provide a metal interconnect for the circuit. As will be apparent from FIG. 1e, the well 26 has a beveled upper edge 32, the horizontal extent of which is indicated by the dimension C—C. This dimension is typically from 1,000 to 10,000 Angstroms. Additionally the well has a substantially vertical wall 24, the verticality being as good as can be obtained with an anisotropic etch acting vertically on the oxide layer.

The structure of FIG. 1e may be subsequently processed as shown in FIG. 2 to provide an overlying metal interconnect layer 36. It should first be observed that the metal interconnection layer has virtually complete step coverage, i.e., the metal layer continuously covers upper surfaces 38 of the silicon oxide layer and exposed surfaces 40 of the substrate, as well as the side walls of the wells 42 and 44. This step coverage is facilitated by the beveled edges in the walls of the silicon oxide layer.

FIG. 2 also illustrates another important feature of the present invention. The substrate shown in FIG. 2 has a substantially horizontal surface with a step 46 such as might be caused by underlying features in the substrate, for example, areas of deposited polysilicon, field oxide regions defining device islands, etc. As a result of this step 46, horizontal surfaces 40 of the substrate lie at different levels. The wells 42 and 44 may be of different depth as shown. By employing the techniques of the present invention, the profiles of each well have in common a vertical portion 48 of varying length and a bevel depth, indicated by the dimension D, which is substantially the same from well to well and is substantially independent of oxide thickness, composition and surface topology. On a sample measured with a scanning electron microscope, the depth D was found to vary less than 500 Angstroms from well to well.

FIGS. 3a through 3e are cross-sectional views of an integrated circuit structure illustrating sequential fabrication steps of another preferred embodiment of the present invention employing a layer of ion damaged silicon oxide.

Referring first to FIG. 3a, a silicon oxide layer 50 is shown overlying a horizontal surface of a substrate 52. An upper portion of the silicon oxide layer indicated by the dimension E—E, is ion damaged by impacting the surface with accelerated ions. Advantageously this ion damaged layer may be from 100 to 2,000 Angstroms in thickness. It will be understood that the impact of the ions disrupts the structure of the silicon dioxide making it more susceptible to certain kinds of etching. This enhanced etching susceptibility is employed to facilitate the formation of beveled well walls. FIG. 3b illustrates the structure of FIG. 3a after a photoresist mask layer 54 has been deposited and developed on the ion damaged layer 56. The structure of FIG. 3b may then be exposed to a two stage etching procedure. First, an anisotropic plasma etch may be performed, similar to that discussed above in connection with FIG. 1, to form essentially vertical walls 58 in the silicon oxide layer 50. See FIG. 3c. A final isotropic etch may be employed to remove any residual oxide from a horizontal surface 60 of the substrate and to form beveled edges 62 in the walls of the well 64. It will be understood that the horizontal extent of the beveling will be dictated, as in the other embodiments of the invention discussed above, by the horizontal dimension of the exposed peripheral edge window 66. The dimensions of this window, are, in turn, substantially defined by the extent to which the ion damaged layer 56 is etched away during the isotropic etch step. It will also be understood that this peripherial etch window is self aligned with the well 64 in that a separate masking and alignment step is not required to form this window or the resultant structure—the beveled edge in the wall of the well.

Although the foregoing invention has been described in connection with certain preferred embodiments, it is to be understood that variations and modifications may be resorted to as would be apparent to those skilled in the art. Such variations and modifications are to be considered within the purview and the scope of the claims attached hereto.

I claim:

1. A method for forming a feature in a layer of silicon oxide overlying a substrate, wherein the feature is defined, at least in part, by a wall of the silicon oxide layer extending substantially perpendicularly from a horizontal principal plane of the substrate to a beveled edge joining the wall to a principal surface of the silicon oxide layer, comprising the steps of:

providing a substrate with a layer of silicon oxide thereon;

forming an etching mask for the layer of silicon oxide including a first mask layer and a second mask layer overlying the first layer, wherein an opening is formed in the second mask layer for defining the feature in the silicon oxide layer, said opening having a peripheral edge, and wherein said first mask layer is etched to undercut the second mask layer in a region adjacent to the peripheral edge of the opening;

anisotropically etching silicon oxide exposed in the opening to form a generally vertical wall in the silicon oxide at the edge of the opening in the second mask layer; and isotropically, chemically etching the silicon oxide to bevel the edge in the undercut region;

whereby, the beveled edge is formed in the silicon oxide layer.

2. The method of claim 1 wherein the anisotropic etching is performed with a fluorine deficient plasma.

3. The method of claim 1 wherein the second mask layer is a photoresist layer and the first mask layer is a film separately deposited on the silicon oxide layer and wherein said film is selectively etched by an etchant which more rapidly attacks the film than the silicon oxide or photoresist, to form said undercut region.

4. The method of claim 3 wherein the film is of a material selected from the group consisting of metal film, silicon nitride film, silicon and polymer film.

5. The method of claim 3 wherein the film is an aluminum film between 100 and 2,000 Angstroms in thickness.

6. The method of claim 1 wherein the first mask layer is formed by ion damaging a surface layer of the silicon dioxide layer and selectively etching the ion damaged layer to undercut the second mask layer.

7. The method of claim 6 wherein the ion damaged layer is from 100 to 2,000 Angstroms thick.

8. A method of etching a well in first layer of material overlying a horizontal surface of a substrate comprising the steps of:

depositing a film of etchable material on an exposed surface of the first layer of material overlying the substrate;

forming a mask layer on said film layer with at least one window opening onto the film of etchable material;

etching said film to undercut said mask layer around a peripheral edge of the window opening;

anisotropically etching the first layer through the window to form a well with a wall substantially vertical to the horizontal surface of the substrate; and isotropically etching the first layer to bevel a peripheral edge of the well formed in the first layer, whereby said edge in the first layer is exposed to the isotropic etching from a surface of the substantially vertical wall and from a surface exposed by the undercutting of said mask layer.

9. The method of claim 8 wherein the first layer is a silicon oxide layer.

10. The method of claim 8 wherein the film of etchable material is selected from the group consisting of metal film, silicon nitride film, silicon and polymer film.

11. The method of claim 10 wherein the film is a film of aluminum from 100 to 2,000 Angstroms in thickness.

12. The method of claim 8 wherein the anisotropic etching is performed by dry etching.

13. The method of claim 8 wherein a thin residual layer of silicon oxide is removed in said well to expose the substrate during said isotropic etching.

14. A method of etching a well with a beveled edge in a layer of silicon oxide overlying a horizontal surface of a substrate, comprising the steps of:

ion implanting the layer of silicon oxide to damage a layer of silicon oxide at the surface of the layer of silicon oxide, the damaging of the silicon oxide rendering it more susceptible to chemical etching;

forming a mask layer on the surface of the damaged silicon oxide layer to define at least one window opening onto the surface of the silicon dioxide;

anisotropically etching said silicon dioxide to form a well with a generally vertical wall intersecting the surface of the silicon dioxide generally perpendicularly at a window edge defined by said mask layer; and isotropically chemically etching said silicon dioxide layer to bevel said window edge, said window edge being exposed to the chemical etching from the vertical wall and through the damaged layer.

15. The method of claim 14 wherein a thin residual layer of silicon oxide is removed in said well to expose the substrate during said isotropic chemical etching.

16. The method of claim 14 wherein said anisotropic etching is performed with a fluorine deficient plasma.

* * * * *